US006514876B1

(12) United States Patent
Thakur et al.

(10) Patent No.: US 6,514,876 B1
(45) Date of Patent: Feb. 4, 2003

(54) PRE-METAL DIELECTRIC RAPID THERMAL PROCESSING FOR SUB-MICRON TECHNOLOGY

(75) Inventors: Randhir P. S. Thakur, San Jose, CA (US); John H. Das, Freemont, CA (US); Dave Clarke, Newberg, OR (US)

(73) Assignee: Steag RTP Systems, Inc., San Jose, CA (US)

( * ) Notice: Subject to any disclaimer, the term of this patent is extended or adjusted under 35 U.S.C. 154(b) by 0 days.

(21) Appl. No.: 09/644,759

(22) Filed: Aug. 23, 2000

Related U.S. Application Data

(60) Provisional application No. 60/152,698, filed on Sep. 7, 1999.

(51) Int. Cl.[7] ............................................. H01L 21/44
(52) U.S. Cl. .................... 438/762; 438/646; 438/632
(58) Field of Search .............................. 438/761, 762, 438/646

(56) References Cited

U.S. PATENT DOCUMENTS

| 4,455,325 | A |   | 6/1984  | Razouk              |         |
|-----------|---|---|---------|---------------------|---------|
| 5,633,211 | A |   | 5/1997  | Imai et al.         |         |
| 5,753,948 | A | * | 5/1998  | Nguyen et al.       | 257/307 |
| 5,770,469 | A | * | 6/1998  | Uram et al.         | 437/240 |
| 5,807,792 | A | * | 9/1998  | Ilg et al.          | 438/758 |
| 6,008,120 | A | * | 12/1999 | Lee                 | 438/634 |
| 6,048,475 | A | * | 4/2000  | Kirchhoff et al.    | 252/950 |
| 6,177,344 | B1| * | 1/2001  | Xia et al.          | 438/646 |
| 6,261,975 | B1| * | 7/2001  | Xia et al.          | 438/783 |

FOREIGN PATENT DOCUMENTS

| GB | 2168340     | 11/1985 |
|----|-------------|---------|
| JP | 58012340    | 1/1983  |
| JP | 58006138    | 12/1983 |
| JP | 06151416    | 5/1984  |
| JP | 6177129     | 6/1994  |
| JP | 10223859    | 8/1998  |
| KR | 9407068 B1  | 8/1994  |
| WO | WO 00/31788 | 6/2000  |

OTHER PUBLICATIONS

W. J. Shaffer; "300–mm Premetal Dielectric Processing"; p. 117; Sep. 1997; *Solid State Technology*.
PCT International Search Report, Jan. 9, 2000.
"Reduced Thermal Budget Borophosphosilicate Glass (BPSG) Fusion And Implant Activation Using Rapid Thermal Annealing And Steam Reflow", R. P. S. Thakur, et al., *Mat. Res. Soc. Symp. Proc.*, vol. 303, 1993, pp. 283–288.

* cited by examiner

Primary Examiner—David Nelms
Assistant Examiner—Thao Le
(74) Attorney, Agent, or Firm—Dority & Manning, P.A.

(57) ABSTRACT

A process for forming silicate glass layers on substrates is disclosed. A silicate glass layer is first deposited onto a substrate, such as a semiconductor wafer. The wafer is then placed in a thermal processing chamber and heated in the presence of a reactive gas. The object is heated to a temperature sufficient for reflow of the silicate glass. In one embodiment, the atmosphere contained within the processing chamber comprises steam in combination with a reactive gas. The reactive gas can be, for instance, hydrogen, oxygen, nitrogen, dinitrogen oxide, ozone, hydrogen peroxide, atomic and/or molecular hydrogen, or radicals or mixtures thereof.

34 Claims, 3 Drawing Sheets

(a) 750 °C 30 sec N₂    (b) 750 °C 90 sec N₂    (c) 750 °C 180 sec N₂
(d) 750 °C 30 sec steam (e) 750 °C 90 sec steam (f) 750 °C 180 sec steam SEM cross-sections showing the flow angle variation with time at 750 °C for N₂ and steam processes.

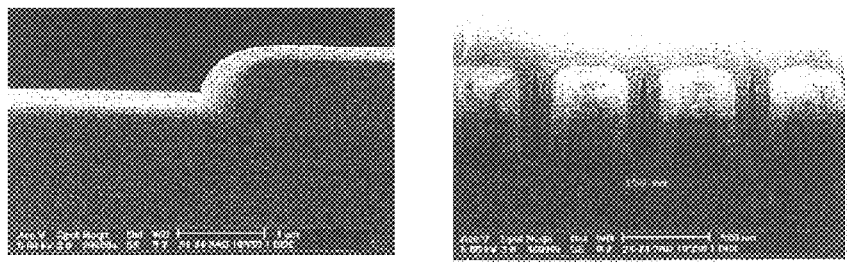
Figure 1. SEM cross-sections showing the as-deposited film (a) step coverage and (b) Gap fill behavior.

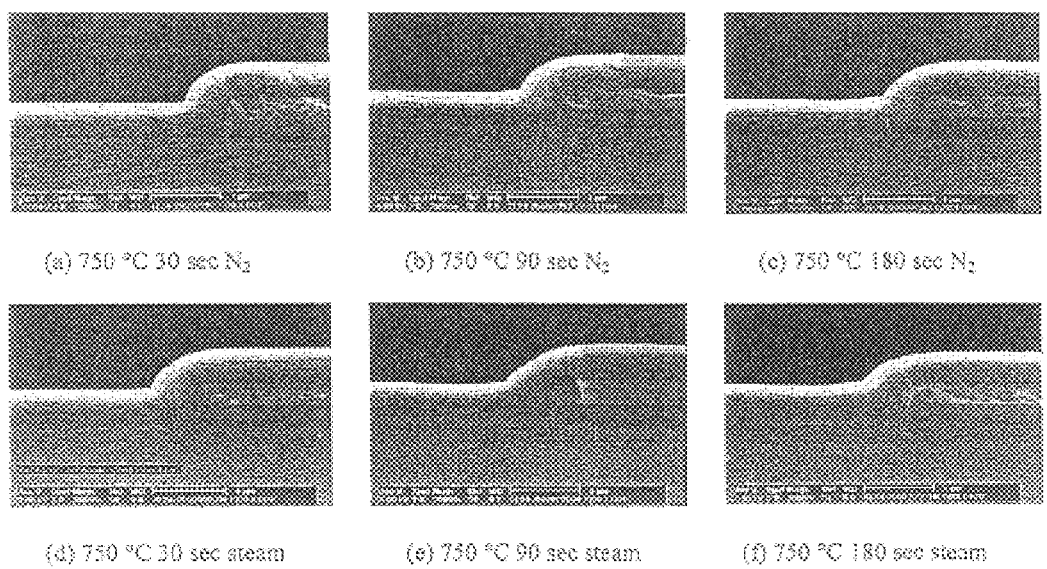
Figure 2. SEM cross-sections showing the flow angle variation with time at 750 °C for $N_2$ and steam processes.

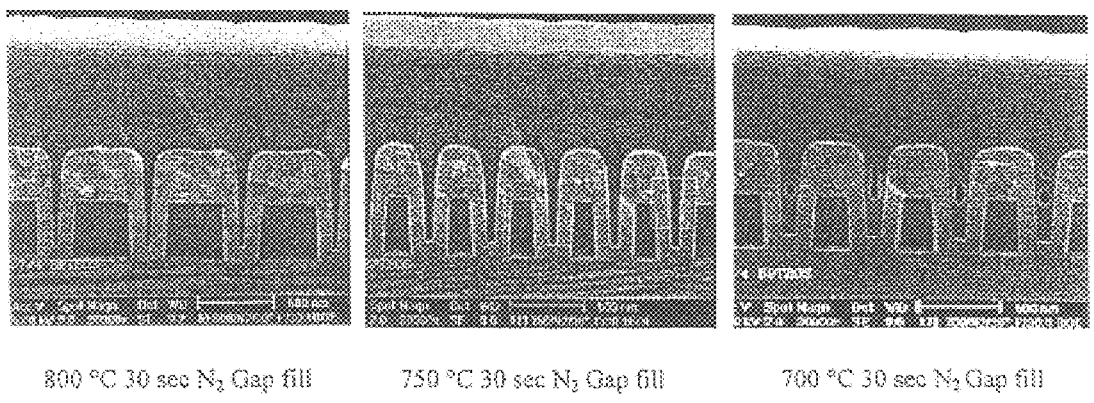
Figure 3. SEM micrographs showing gap fill behavior of BPSG films annealed in N2.
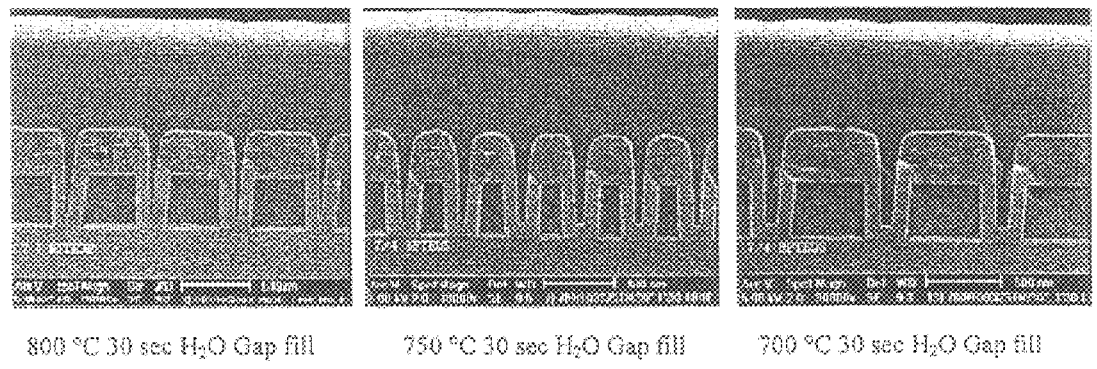
Figure 4. SEM micrographs showing gap fill behavior of BPSG films annealed in steam.

PRE-METAL DIELECTRIC RAPID THERMAL PROCESSING FOR SUB-MICRON TECHNOLOGY

RELATED APPLICATIONS

The present application is based on a provisional application having Ser. No. 60/152,698 filed on Sep. 7, 1999.

BACKGROUND OF THE PRESENT INVENTION

Over the years, silicate glass such as borophosphosilicate glass (BPSG) has played a critical role as a pre-metal dielectric (PMD) insulator for semiconductor devices. Recently, the geometry of semiconductor devices has become increasingly smaller. For example, device geometry has diminished to sub 0.25 µm levels and even to 0.15 µm and beyond. Consequently, it has become much more difficult to properly fill the gaps of the interlayer dielectric layers, i.e. satisfy "gap fill" requirements.

Typically, the integrity of the shallow junctions of a semiconductor device can only be maintained by restricting the thermal budget requirements of post-junction flow processes. Such reduced thermal budgets are essential for keeping the lateral and vertical diffusion of dopants to a minimum and to maintain the ultra-shallow junction integrity of sub-micron devices. However, reducing thermal budgets in this manner poses a challenge to maintaining the gap-fill requirements and surface planarity desired for PMD BPSG films.

As mentioned above, traditional BPSG films and annealing techniques are no longer suitable for satisfying flow and "gap fill" requirements of interlayer dielectric layers. Complete gap fill is realistically only possible with these structures if the anneal process allows the flow of the deposited films.

In furnaces, the use of wet steam reflow processes has shown some improvement of BPSG flow over dry nitrogen under identical annealing conditions. As such, a wet steam reflow process is currently preferred over dry nitrogen in furnace flow processes. Similar to furnace applications, comparable studies have also been conducted for the use of wet steam in rapid thermal processing. These studies demonstrated similar reflow results for RTP processed BPSG films at significantly reduced process thermal budgets.

For example, RTP processed BPSG films for PMD have recently been demonstrated for 300-mm generation applications (see Schaffer. et al., *Solid State Technology*, p. 117, September 1997). During the demonstrations, the films were first densified in RTP, and then further planarized by chemical mechanical planarization (CMP). The films used in the 300-mm demonstrations were TEB/TEP$_o$ 7.05 B wt %/3.79 P wt % BPTEOS films. These films were deposited at 500° C. with their dopant levels verified by wet chemical analysis methods. The alternate dopant chemistries allowed higher dopant levels, thus accounting for the reduction of the flow temperature of these films.

Despite the above advances, a need nevertheless exists for BPSG films having improved chemistry. Moreover, a need exists for annealing techniques applicable to sub-micron devices that can optimize BPSG film properties to achieve superior stability, while also allowing BPSG film flow at reduced temperatures.

SUMMARY OF THE INVENTION

The present invention recognizes and addresses the foregoing disadvantages and others of prior art constructions and methods.

Accordingly, it is an object of the present invention to provide an improved method for forming layers in integrated circuits.

In general, the method includes the steps of processing an object, such as a semiconductor wafer, in a rapid thermal processing (RTP) system. The object placed in the RTP system is at least partly covered by at least one (1) layer comprising silicate glass. Once placed into the RTP system, the object is heated in an atmosphere comprising at least one reactive gas that is reactive to at least one material covered by the glass. Specifically, the object is heated to a temperature sufficient for reflow of the silicate glass within a predetermined time. While the object is being heated, the concentration of the reactive gas is controlled for selective reaction of the gas with the material.

In one embodiment, the atmosphere contained within the RTP system comprises steam in combination with a reactive gas. The reactive gas can be, for instance, hydrogen, oxygen, nitrogen, dinitrogen oxide, ozone, hydrogen peroxide, atomic and/or molecular hydrogen, or in general radicals or mixtures thereof. In general, the volume ratio between the steam and the reactive gas is between about 1:0.01 to about 1:1,000.

According to the process of the present invention, the steam contained with the RTP system is diluted with other gases as described above so that the steam does not oxidize materials covered by the silicate glass.

In an alternative embodiment of the present invention, the atmosphere contained within the RTP system is an inert gas, such as argon or nitrogen. In this embodiment, steam can be present to reflow the silicate glass while the inert gas is used to protect other layers on the substrate. For instance, steam can be present in accordance with the present invention at a concentration insufficient to cause adverse oxidation reactions from occurring.

Other features and aspects of the present invention are discussed in greater detail below.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying figures, in which:

FIG. 1 is a photographic representation of the results obtained in the example;

FIG. 2 is a photographic representation of the results obtained in the example;

FIG. 3 is a photographic representation of the results obtained in the example; and FIG. 4 is a photographic representation of the results obtained in the example.

Repeat use of reference characters in the present specification and drawings is intended to represent same or analogous features or elements of the invention.

DETAILED DESCRIPTION OF PREFERRED EMBODIMENTS

It is to be understood by one of ordinary skill in the art that the present discussion is a description of exemplary embodiments only, and is not intended as limiting the broader aspects of the present invention, which broader aspects are embodied in the exemplary construction.

In general, the present invention is directed to a silicate film that has improved chemistry to satisfy reduced thermal budget reflow requirements. For instance, the silicate film can be borophosphosilicate glass (BPSG), nitrosilicate glass (NSG), and the like. Moreover, the present invention is directed to improved film deposition techniques for providing better film stability and improved flow properties. Furthermore, the present invention is also directed to a doped film capping process that allows the penetration of process gas during rapid thermal processing (RTP) to enhance the removal of voids in the gaps to improve surface planarity.

The process of the present invention can be used to form and improve various film layers during the manufacture of integrated circuit chips. As used herein, the term forming is intended to mean a flow or reflow of a film like a BPSG film to improve the properties of the film, such as gap filling properties. However, the invention also comprises the formation of a new and/or additional layer or parts of the layer, such as in selective processes like selective oxidation or reduction or in processes in which e.g. a layer of nitride, oxynitride, silicon oxynitride is formed. However, also other layers of other chemical composition can be formed.

In accordance with the present invention, wet steam can be used as an ambient gas when processing a BPSG film using rapid thermal processing (RTP). The use of wet steam, which is an oxidizing agent, can help grow back the gate oxide film layer that was etched away during patterning of the metal gate.

As used herein, a rapid thermal processing chamber refers to a device that rapidly heats objects, such as semiconductor wafers. Such devices typically include a substrate holder for holding a semiconductor wafer and a light source that emits light energy for heating the wafer. During heat treatment, the semiconductor wafers are heated under controlled conditions according to a preset temperature regime. Rapid thermal processing chambers are capable of heating wafers very quickly to relatively high temperatures for times that are typically less than a few minutes.

As stated above, the wafers are heated using light energy. As used herein, light energy refers to radiant energy like e.g. ultraviolet light, visible light and/or infrared light or a combination thereof such to get a predetermined spectrum of the radiant energy. This offers the possibility of a selective heating of stacked films or structures on a substrate, resulting in controllable temperature distributions of the films or structures which can support selective reactions on the wafer. The reactions comprise not only chemical reactions like reduction or oxidation e.g. selective oxidation as described herein, but also can include physical reactions e.g. like the modification of a surface by influencing the viscosity of a film like a silicate film. Further, selectivity regarding radiation also can be done or supported by an appropriate ratio of coherent and incoherent contributions of the radiant energy. For example, coherent laser light can be mixed with incoherent light from e.g. halogen lamps. Also, different parts of the substrate can be irradiated with different light such like different spectral for coherent/incoherent composition. As an example, the front and backside of a substrate can be irradiated with such different light. The coherent length of the light is influencing potential interference effects on the substrate surface, especially if patterned wafers or wafers with a stack of films are processed in the heat treating apparatus.

Various experiments were conducted to demonstrate flow and gap fill results of one embodiment of the present invention at significantly reduced temperatures. In particular, as discussed in more detail below, experiments were conducted to test BPSG films processed with steam and dry nitrogen in rapid thermal processing. The experiments generally illustrate some of the beneficial aspects of the present invention, including, for example, some of the benefits of using wet steam in rapid thermal processing. For each of the experiments discussed, BPSG films were deposited on sub 0.15 $\mu$m test structures suitable for Gigabit Dram applications.

Referring to FIG. 1, the typical, as-deposited PMD film step coverage and gap fill behaviors are shown. As shown, large voids are clearly visible in the gaps. A STEAMPULSE RTP tool (available from Steag RTP Systems, San Jose, Calif.) was used for processing the samples shown in FIG. 1. Both the wet steam and dry nitrogen process temperatures were varied between about 700° C. and about 800° C. to investigate the effect of temperature variation on gap fill and flow behavior of the films. The experiments were conducted with process times ranging from about 30 to about 180 seconds to monitor the progression of the reflow at these temperatures.

In order to illustrate improved flow results of BPSG films in accordance with the present invention, flow angle monitoring experiments were conducted at 750° C. and 800° C. with process times of 30, 90, and 180 seconds. During the RTP processes, the flow of the steam was two (2) liters of steam per minute. These experiments were repeated after switching the process steam to dry nitrogen to obtain a measure of the flow enhancement due to the wet steam process.

Referring to FIG. 2, the SEM cross-sections illustrate the various flow angles obtained from the 750° C. processed samples that were annealed in wet steam and dry nitrogen. As shown, the flow angles improved with increased process time in each instance. Moreover, it is clearly evident that the steam process samples produced significantly improved flow results. The estimated dry and wet process flow angles from these experiments are present in Table I below.

TABLE I

Estimated BPSG flow angles of 750° C. and 800° C. RTP processes using $N_2$ and steam flow

| Process Time(s) | 750° C. BPSG reflow process | | 800° C. BPSG reflow process | |
| --- | --- | --- | --- | --- |
| | $N_2$ Process | $H_2O$ Process | $N_2$ Process | $H_2O$ Process |
| 30 | 67 | 64 | 61 | 45 |
| 90 | 62 | 59 | 55 | 41 |
| 180 | 54 | 48 | 46 | 36 |

In order to demonstrate the gap fill behavior of BPSG films in accordance with the present invention, various gap fill experiments were conducted. The BPSG films were deposited on test structures with varying gap sizes and gaps aspect ratios [gap height:gap width]. The gap sizes of the test structures ranged from about 0.85 microns to about 0.02 microns, with the aspect ratios of the test structures ranging from about 2:1 to about 10:1. The samples were annealed for 30 seconds at 700° C., 750° C., and 800° C. in steam and dry nitrogen.

Referring to FIGS. 3 and 4, the SEM cross-sections illustrate the results obtained for the gap fill experiments. FIG. 3 represents the results for the dry nitrogen tests, while FIG. 4 represents the results for the steam tests. As shown, at 800° C., both the steam and dry nitrogen processes produced void free gap fill of the 0.02-micron gaps with aspect ratios of up to 10:1.

As illustrated in FIG. 3, the gap fill capability of dry nitrogen processes significantly diminished at the reduced 750° C. anneal temperature. Moreover, at 750° C., only 0.25 micron gaps with 2:1 aspect ratios were filled during the dry nitrogen process, while 0.04 micron gaps with 10:1 aspect ratios were filled during the steam process (see FIG. 4).

Furthermore, as shown in FIGS. 3 and 4, at 700° C., the gap fill capability of both processes declined. Gaps with aspect ratios of only 2:1 could be filled. However, the steam process consistently produced better gap fill results than dry nitrogen at this temperature. The gap fill process results are presented in Table II.

TABLE II

The 700° C., 750° C. and 800° C. 30 second RTP processed BPSG Gap Fill data

| Temperature (° C.) | Dry $N_2$ Gap fill process | | Wet Steam Gap fill process | |
| --- | --- | --- | --- | --- |
| | Gap Size ($\mu$m) | Gap Aspect Ratio | Gap Size ($\mu$m) | Gap Aspect Ratio |
| 800 | 0.02 | 10:1 | 0.02 | 10:1 |
| 750 | 0.25 | 2:1 | 0.04 | 10:1 |
| 700 | 0.44 | 2:1 | 0.25 | 2:1 |

The results above indicate improvements using the steam process as compared to the dry nitrogen process. Moreover, the flow angle monitoring results showed improvement in the flow angles with increased process time and temperatures for both the steam and dry nitrogen processes. Superior gap fill and flow results have been observed from both steam and dry nitrogen RTP anneal processes. Both processes are suitable for sub-micron technology with aspect ratios up to 10:1.

At 800° C., both processes produced good gap fill results, while the steam process exhibited improved flow capabilities at lower temperatures. At 750° C. and lower, for example, the gap fill capability of the dry nitrogen process declined, while the steam process demonstrated a consistent improvement in gap fill behavior.

Thus, wet steam processes significantly reduced process thermal budgets for BPSG films. However, in many device applications that lack adequate diffusion barriers to steam, pure steam process gases may not be suitable due to the highly oxidizing nature of the hot process steam.

In particular, in some applications, such as Dram and other high-speed device applications, it is often desired to replace polysilicon conducting paths (lines) with more conductive metals, such as tungsten. Tungsten, for example, has a much lower resistance than even heavily doped polysilicon. Such a reduced resistance can improve the overall frequency response of the devices by reducing the "RC" values, i.e. resistance multiplied by capacitance. The RC value, also known as the time constant, determines how fast the stored charge from the conductor lines can be removed or how fast a ground zero line can be charged up to a higher potential (switching on/off). However, while patterning a metal film suitable to the conductor lines, it attacks the gate oxide film as well. For a device to properly function, the etched oxide film must be regrown.

As stated above, the use of wet steam can often help the etched oxide film be regrown. However, the regrowth of the oxide film is an oxidation process that also tends to oxidize the metal itself. For example, regrowth would oxidize a tungsten metal to form oxidized tungsten. Oxidized tungsten has a high resistance, which can render the metal useless in high-speed applications.

Therefore, in accordance with the present invention, a method and system are provided for effectively reflowing gate oxide films without affecting the metals themselves. In particular, the oxidizing nature of a wet steam process of the present invention can be modified to reduce the highly oxidizing nature of pure steam. The process steam can be diluted with any compound that allows the oxidizing nature of the pure steam to be sufficiently controlled.

The process of the present invention is particularly well suited for reflowing silicate films, such as BPSG or NSG. When the process is carried out in a rapid thermal processing chamber in the presence of steam, it has been discovered that the temperatures can be minimized. For instance, BPSG can be processed according to the present invention at temperatures lower than about 900° C., and particularly from about 800° C. to about 850° C. NSG, on the other hand, requires a slightly higher temperature. Specifically, NSG can be processed at temperatures less than about 1200° C., such as from about 1100° C. to about 1150° C.

During the process of the present invention, steam can be diluted with various gasses. For instance, the diluent gas can be an inert gas, an oxidizing gas, or a reducing gas. The diluent gas chosen for a particular application, will depend upon the desired results. For instance, an inert gas can be added to control the reaction of steam with any layers contained under the silicate glass. Oxidizing gasses and reducing gasses on the other hand, can be added to selectively react with components under the silicate glass layer. Further, a reducing gas can be used to reverse any oxidation caused by the steam itself.

Examples of inert gasses include nitrogen and argon. Oxidizing gasses include oxygen, ozone, hydrogen peroxide, radicals thereof and mixtures thereof. Reducing gasses include atomic hydrogen, molecular hydrogen, $N_2H_2$, radicals thereof, and mixtures thereof.

For most applications, steam should be present in the gas stream in an amount up to about 99.9% by volume, and particularly from about 10% by volume to about 90% by volume. The amount of steam present in the processing gas will depend upon the particular application. For instance, when the selective flow process of the present invention is carried out in the presence of a metal, metal silicide, tungsten nitride or other metal containing compound, steam should be present in an amount no greater than 50% by volume. In other embodiments, however, such as when combined with nitrogen, steam should be present in the processing gas and an amount greater than 50% by volume.

In one embodiment of the present invention, wet steam is diluted with hydrogen. One benefit of diluting the wet steam with hydrogen is that hydrogen is a reducing agent. The presence of a reducing agent, such as hydrogen, can generally protect a metal from oxidation during reflowing of a gate oxide film. Specifically, hydrogen can constantly reduce the metal from oxidizing in the steam. Moreover, such a reducing agent typically has no affect on the silicon oxidation process.

Hydrogen can typically be present in an amount such that the $H_2O : H_2$ ratio is from about 1:0.01 to about 1:1000. In one example of a hydrogen-diluted steam process of the present invention, wet steam was diluted with hydrogen at the ratio of about 1/250 ($H_2O/H_2$). Such a 1/250 ($H_2O/H_2$) ratio was achieved using a 5 standard liter per minute flow of hydrogen in minute amounts of steam, i.e. 20 cubic centimeters per minute. With the above steam/hydrogen flow, layers of up to 25 Å of oxide film were grown onto tungsten for Gbit Dram devices without oxidizing the tungsten itself.

In accordance with the present invention, it is also generally desired to supply the gases in the processing chamber at a positive pressure (i.e., above atmospheric pressure). Positive pressure can be effectively supplied according to the present invention by any suitable method known in the art.

The need for positive pressure is particularly relevant when wet steam is diluted with hydrogen for rapid thermal processing. Specifically, when hydrogen and oxygen are heated to temperatures above about 550° C., water can be formed causing a violent explosion. For wet oxidation processes of the present invention, hydrogen can be present at high temperatures, such as around 850° C. Moreover, oxygen, which is present in abundance in air, can often leak into the processing oven during wafer processing due to poor sealing. Thus, when hydrogen is used in the present invention, it is often desired to achieve a positive pressure within the processing chamber. Positive pressure can effectively prevent ambient oxygen from leaking into the oven or oven door, thus making processing safer when hydrogen is used to dilute wet steam as described above.

In addition to providing safety, positive pressure can also provide various other benefits, even when hydrogen is not used to dilute wet steam. For example, some benefits of positive pressure include, but are not limited to, enhancing both reflow and gap fill (both are strongly dependent on the partial pressure of steam in the process ambient), enhancing process gas penetration capability in the bulk of BPSG films, preventing the intake of unwanted oxygen (a strong oxidizing agent) in non-hydrogen applications, and preventing intake of unwanted nitrogen in certain applications.

As mentioned above, in addition to diluting wet steam with hydrogen, other gases can also be used to dilute wet steam in accordance with the present invention. Generally, the gases can include inert, reducing, and/or oxidizing gases, and can be used in combination with hydrogen or alone to control the concentration of the wet steam. For example, the process steam can be diluted with nitrogen, oxygen, argon, hydrogen peroxide, dinitrogen oxide, or any combination thereof. As stated above, the use of such gases allows the concentration of the wet steam to be varied and controlled. Control of wet steam concentration can be important in many applications. In particular, concentration of wet steam is dependent on time and/or temperature. Thus, because diffusion constants are also temperature dependant, control of wet steam concentration by the dilution gases mentioned herein allows the possibility of selective reactions, e.g. selective oxidation or reduction of layers below the BPSG layer itself.

In this regard, one embodiment of the present invention utilizes wet steam diluted with hydrogen, both of which are present within a background of nitrogen. Nitrogen can help control/minimize degradation by the wet steam. In another embodiment, argon is used as the background for wet steam diluted with hydrogen. Still another embodiment of the present invention includes wet steam diluted with oxygen so as to control the uniformity and quality of the oxide layer.

It should be noted that the above-described method and system of the present invention can be used on various substrates. For example, diluted wet steam can be used for copper reflow, selective oxidation of silicon, selective oxidation of silicon in the presence of materials such as tungsten, tungsten nitride films, silicon nitride films or in general metal, metal nitride, metal oxide or silicide films.

In still another embodiment of the present invention, the process can be used to convert tungsten nitride into tungsten.

These and other modifications and variations to the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention.

What is claimed is:

1. A process for forming layers on a semiconductor wafer comprising the steps of:

providing a thermal processing chamber, said thermal processing chamber being configured to heat semiconductor wafers using light energy;

placing a multilayered semiconductor wafer in said thermal processing chamber, said semiconductor wafer being at least partially covered by a silicate glass, said silicate glass covering at least one other dissimilar material; and heating said semiconductor wafer in said thermal processing chamber in the presence of an atmosphere, said atmosphere comprising at least one reactive gas at a determined concentration, wherein said semiconductor wafer is heated for a time and at a temperature sufficient for reflow of said silicate glass and sufficient for said reactive gas to react with said dissimilar material located beneath said silicate glass.

2. A process as defined in claim 1, wherein said atmosphere comprises steam combined with said reactive gas.

3. A process as defined in claim 2, wherein the volume ratio between steam and the reactive gas is between 1:0.01 and 1:1000.

4. A process as defined in claim 1, wherein the reactive gas comprises a material selected from the group consisting of molecular hydrogen, atomic hydrogen, ozone, oxygen, dinitrogen oxide, hydrogen peroxide, radicals thereof, and mixtures thereof.

5. A process as defined in claim 3, wherein the reactive gas comprises a material selected from the group consisting of molecular hydrogen, atomic hydrogen, ozone, oxygen, dinitrogen oxide, hydrogen peroxide, radicals thereof and mixtures thereof.

6. A process as defined in claim 1, wherein said reactive gas comprises steam and said atmosphere further comprises an inert gas.

7. A process as defined in claim 6, wherein said inert gas comprises argon.

8. A process as defined in claim 6, wherein said inert gas comprises nitrogen.

9. A process as defined in claim 1, wherein said silicate glass comprises borophosphosilicate glass.

10. A process as defined in claim 1, wherein said silicate glass comprises nitrosilicate glass.

11. A process as defined in claim 1, wherein the reactive gas comprises an oxidizing gas.

12. A process as defined in claim 1, wherein the reactive gas comprises a reducing gas.

13. A process for reflowing silicate glass layers on a semiconductor wafer comprising the steps of:

providing a thermal processing chamber, said thermal processing chamber being configured to heat semiconductor wafers using light energy;

placing a semiconductor wafer in said thermal processing chamber, said semiconductor wafer including a silicate glass coating; and heating said semiconductor wafer in said thermal processing chamber while flowing a gas stream through said chamber, said gas stream comprising steam diluted with at least one other gas.

14. A process as defined in claim 13, wherein said gas stream has a volumetric flow rate of from about 0.2 liters per minute to about 15 liters per minute.

15. A process as defined in claim 13, wherein said at least one other gas comprises a material selected from the group consisting of oxygen, nitrogen, argon, hydrogen peroxide, molecular hydrogen, atomic hydrogen, ozone, dinitrogen oxide, radicals thereof, and mixtures thereof.

16. A process as defined in claim 15, wherein said at least one other gas comprises hydrogen.

17. A process as defined in claim 13, wherein said semiconductor wafer is heated in said thermal processing chamber to a temperature from about 700° C. to about 900° C.

18. A process as defined in claim 16, wherein during said process said thermal processing chamber is maintained at a pressure higher than the pressure of the atmosphere surrounding the chamber.

19. A process as defined in claim 16, wherein said semiconductor wafer is heated in said thermal processing chamber to a temperature from about 700° C. to about 900° C. for a time less than about 180 seconds.

20. A process as defined in claim 13, wherein said other gas comprises an oxidizing gas.

21. A process as defined in claim 13, wherein said other gas comprises a reducing gas.

22. A process as defined in claim 13, wherein said other gas comprises an inert gas.

23. A process as defined in claim 13, wherein said other gas comprises nitrogen and wherein said nitrogen is present in said gas stream in an amount up to about 50% by volume.

24. A process as defined in claim 13, wherein said other gas comprises hydrogen or oxygen and wherein said steam is present within said gas stream in an amount less than about 90% by volume.

25. A process as defined in claim 13, wherein said silicate glass comprises borophosphosilicate glass.

26. A process as defined in claim 13, wherein said silicate glass comprises nitrosilicate glass.

27. A process for reflowing silicate glass layers on a semiconductor wafer comprising the steps of:
providing a thermal processing chamber, said thermal processing chamber being configured to heat semiconductor wafers using light energy;
placing a semiconductor wafer in said thermal processing chamber, said semiconductor wafer including a silicate glass coating;
heating said semiconductor wafer in said thermal processing chamber while flowing a gas stream through said chamber, said semiconductor wafer being heated to a temperature and for a time sufficient for said silicate glass to reflow; and
maintaining said thermal processing chamber at a pressure greater than the pressure of the surrounding atmosphere while heating said semiconductor wafer.

28. A process as defined in claim 27, wherein said gas stream comprises a mixture of steam and hydrogen.

29. A process as defined in claim 27, wherein said gas stream has a volumetric flow rate of from about 2 liters per minute to about 7 liters per minute.

30. A process as defined in claim 27, wherein said silicate glass comprises borophosphosilicate glass and wherein said semiconductor wafer is heated in said thermal processing chamber to a temperature from about 700° C. to about 900° C.

31. A process as defined in claim 27, wherein said silicate glass comprises nitrosilicate glass, and wherein said semiconductor wafer is heated in said thermal processing chamber to a temperature of from about 1100° C. to about 1200° C.

32. A process as defined in claim 27, wherein said steam is present within said gas stream in an amount insufficient to react with a material located below said silicate glass.

33. A process as defined in claim 27, wherein said other gas comprises nitrogen and wherein said nitrogen is present in said gas stream in an amount up to about 50% by volume.

34. A process as defined in claim 27, wherein said other gas comprises hydrogen or oxygen and wherein said steam is present within said gas stream in an amount less than about 90% by volume.

\* \* \* \* \*